United States Patent
Rhee et al.

[19]

[11] Patent Number: 6,140,158
[45] Date of Patent: Oct. 31, 2000

[54] METHOD OF MANUFACTURING THIN FILM TRANSISTOR-LIQUID CRYSTAL DISPLAY

[75] Inventors: Jeong Hun Rhee, Seoul; Seong Sil Im, Kyoungki-do, both of Rep. of Korea

[73] Assignee: Hyundai Electronics Industries Co., Ltd., Kyoungki-do, Rep. of Korea

[21] Appl. No.: 09/342,609

[22] Filed: Jun. 29, 1999

[30] Foreign Application Priority Data

Jun. 30, 1998 [KR] Rep. of Korea ........................ 98-25836

[51] Int. Cl.⁷ ............................ H01L 21/00; H01L 29/04; H01L 29/786; G02F 1/136
[52] U.S. Cl. ........................... 438/149; 438/151; 438/158; 257/66; 257/72; 349/42
[58] Field of Search .................................... 438/149, 157, 438/176, 193, 283, 587, 981, 30, 151, 158; 257/57, 59, 60, 66, 67, 72; 349/54, 59, 87, 42

[56] References Cited

U.S. PATENT DOCUMENTS

| | | | |
|---|---|---|---|
| 4,422,090 | 12/1983 | Shepherd et al. | 357/23 |
| 4,888,632 | 12/1989 | Haller | 357/23.7 |
| 4,965,646 | 10/1990 | Ipri et al. | 357/23.7 |
| 5,311,041 | 5/1994 | Tominaga et al. | 257/66 |
| 5,346,833 | 9/1994 | Wu | 437/4 |
| 5,478,766 | 12/1995 | Park et al. | 437/40 |
| 5,532,180 | 7/1996 | Den Boer et al. | 437/40 |
| 5,737,041 | 4/1998 | Holmberg et al. | 349/43 |
| 5,814,836 | 9/1998 | Hyun | 257/72 |

OTHER PUBLICATIONS

Loisel et al, "Two Mask Step Plysilicon TFT Technology for Flat Panel Displays", Electronics Letters, 4th Feb. 1988, vol. 24, No. 3, pp. 156–157.

*Primary Examiner*—Matthew Smith
*Assistant Examiner*—Lex H. Malsauma
*Attorney, Agent, or Firm*—Selitto & Associates

[57] ABSTRACT

A method of manufacturing a TFT-LCD which can prevent damage due to a mask process and reduce cost by minimizing mask process number, is disclosed. A three-mask process is required for fabricating a TFT-LCD in the present invention. Firstly, on a transparent insulating substrate are formed a semiconductor layer, a doped semiconductor layer and a first metal layer, sequentially. The first metal layer is then etched using a first mask, to form source and drain electrodes spaced to a selected distance. Next, the doped semiconductor layer is etched using the source and drain electrodes as an etch mask, to form ohmic layers under the source and drain electrodes. A gate insulating layer and a second metal layer are then formed on the overall substrate, in sequence. Thereafter, the second metal layer is etched using a second mask, to form a gate electrode overlapped with the insides of the source and drain electrodes. The gate insulating layer is then etched the gate using electrode as an etch mask, to expose the semiconductor layer and the exposed semiconductor layer is etched using the ohmic layers as an etch mask, to form a channel layer. Next, a transparent metal layer is formed on the overall substrate and etched using a third mask, to form a pixel electrode connected to the source electrode. Furthermore, when forming the pixel electrode, a gate line is connected to a data line by the transparent metal layer in a pad region.

11 Claims, 3 Drawing Sheets

METHOD OF MANUFACTURING THIN FILM TRANSISTOR-LIQUID CRYSTAL DISPLAY

BACKGROUND OF THE INVENTION

1. Field of the Invention

The present invention relates to a method of manufacturing an active matrix type liquid crystal display device, and more particularly to a method of manufacturing a thin film transistor-liquid crystal display device used for a switching element.

2. Description of the Related Art

In general, an active matrix type-liquid crystal display (AM-LCD) device is thin, so that it is often used in various display devices. In this AM-LCD device, one TFT is provided as a switching element for each pixel, so that individual pixel electrodes are independently driven. The contrast is therefore not reduced based upon the reduction of a duty ratio, and also the angle of visibility is not reduced, even when the capacity of display is increased to increase the number of lines.

For fabricating a prior art TFT-LCD, a seven-mask process is required. The seven masks are a first mask for patterning a gate electrode, a second mask for patterning an etch stopper, a third mask for patterning a channel layer, a fourth mask for patterning a pixel electrode, a fifth mask for forming a pad, a sixth mask for patterning source and drain electrodes, and a seventh mask for forming a passivation layer in a TFT region.

However, there is a problem that the seven-mask process is complex, and high in view of cost. Furthermore, damages due to the mask processes occur, thereby deteriorating reliability and yield.

On the other hand, although a method of manufacturing a TFT-LCD using a five-mask process is suggested, the above problems are completely not solved.

SUMMARY OF THE INVENTION

It is therefore an object of the present invention to provide a method of manufacturing a TFT-LCD which can prevent damage due to a mask process and reduce cost by minimizing mask process number.

To accomplish this above object, a three-mask process is required for fabricating a TFT-LCD in the present invention. Firstly, on a transparent insulating substrate are formed a semiconductor layer, a doped semiconductor layer and a first metal layer, sequentially. The first metal layer is then etched using a first mask, to form source and drain electrodes spaced to a selected distance. Next, the doped semiconductor layer is etched using the source and drain electrodes as an etch mask, to form ohmic layers under the source and drain electrodes. A gate insulating layer and a second metal layer are then formed on the overall substrate, in sequence. Thereafter, the second metal layer is etched using a second mask, to form a gate electrode overlapped with the insides of the source and drain electrodes. The gate insulating layer is then etched using the gate electrode as an etch mask, to expose the semiconductor layer and the exposed semiconductor layer is etched using the ohmic layers as an etch mask, to form a channel layer. Next, a transparent metal layer is formed on the overall substrate and etched using a third mask, to form a pixel electrode connected to the source electrode. Furthermore, when forming the pixel electrode, a gate line is connected to a data line by the transparent metal layer in a pad region.

In this embodiment, the transparent metal layer is formed of an indium tin oxide (ITO) layer.

The semiconductor layer is formed of a silicon layer or an amorphous silicon layer.

The doped semiconductor layer is formed of an N+ silicon layer or an N+ amorphous silicon layer.

Furthermore, the gate insulating layer is formed by depositing a SiON layer and a SiNx layer sequentially.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE INVENTION

Hereinafter, a preferred embodiment of the present invention will be explained in more detail with reference to the accompanying drawings.

FIG. 1A to FIG. 1I show cross sectional views for describing a method of manufacturing a TFT-LCD according to an embodiment of the present invention.

Figure 1A:
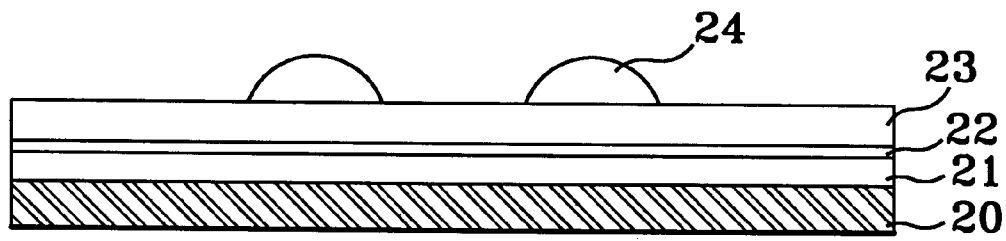
FIG. 1A to FIG. 1I show cross sectional views for describing a method of manufacturing a TFT-LCD according to an embodiment of the present invention.
Figure 1B:
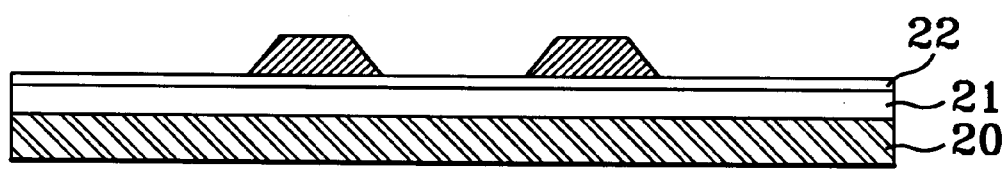

Referring to FIG. 1A, on a transparent insulating substrate 20 such as a glass, are formed a semiconductor layer 21, a doped semiconductor layer 22, and a first metal layer 23 for source and drain electrodes, in sequence. Preferably, the semiconductor layer 21 is formed of a silicon layer or an amorphous silicon layer. The doped semiconductor layer 22 is formed of an N+ silicon layer or an N+ amorphous silicon layer. Next, a first mask 24 is formed on the first metal layer 23 by a first mask process using photolithography. The first metal layer 23 is then etched using the first mask 24 as an etch mask, so that source and drain electrodes 23a and 23b are formed to be spaced to a selected distance, as shown in FIG. 1B. Thereafter, the first mask 24 is removed by a well-known method.

Figure 1C:
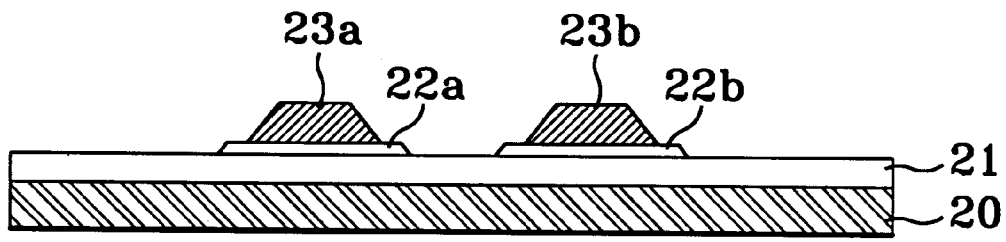
Figure 1D:
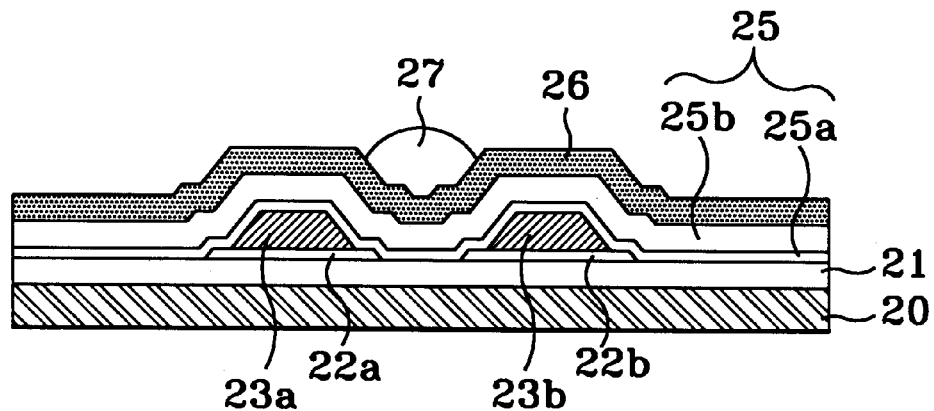

Referring to FIG. 1C, the doped semiconductor layer 22 is etched using the source and drain electrodes 23a and 23b to form ohmic layers 22a and 22b under the source and drain electrodes 23a and 23b. Referring to FIG. 1D, a silicon nitride (SiNx) layer 25a and a silicon oxynitride (SiON) layer 25b are sequentially formed over the structure of FIG. 1C, to form a gate insulating layer 25 and then a second metal layer 26 for a gate is formed thereon. Next, a second mask 27 is formed on the second metal layer 26 by a second mask process using photography. The second mask 27 is formed to cover the second metal layer 26 between the source and drain electrodes 23a and 23b, with overlapping with the insides of the source and drain electrodes 23a and 23b.

Figure 1E:
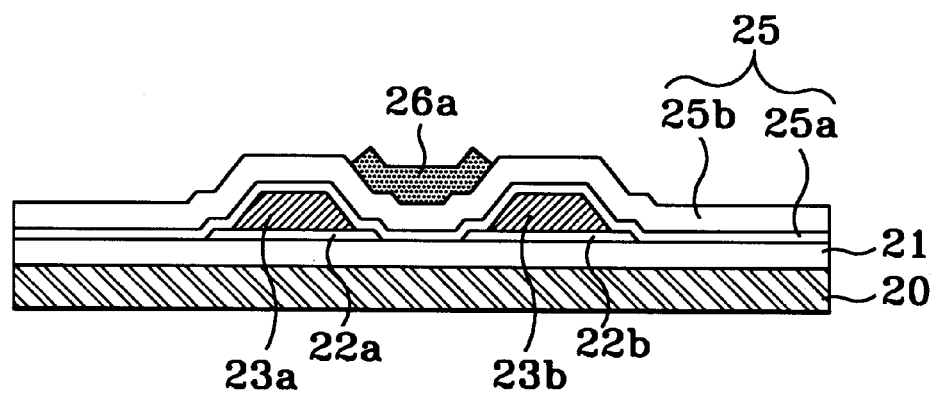
Figure 1F:
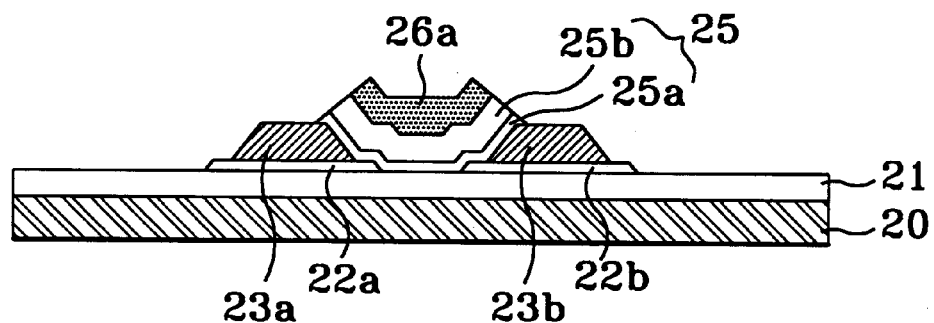

Referring to FIG. 1E, the second metal layer 26 is etched using the second mask 27 as an etch mask to form a gate electrode 26a overlapping with the source and drain electrodes 23a and 23b. The second mask 27 is then removed by a well-known method. Thereafter, the gate insulating layer 25 is etched using the gate electrode 26a as an etch mask, to expose the outside and the upper surface of the source and drain electrodes 23a and 23b and expose the semiconductor layer 21, as shown in FIG. 1F. The exposed semiconductor layer 21 is etched using the ohmic layers 22a to 22b to expose the substrate 20, thereby forming a channel layer 21a.

Figure 1G:
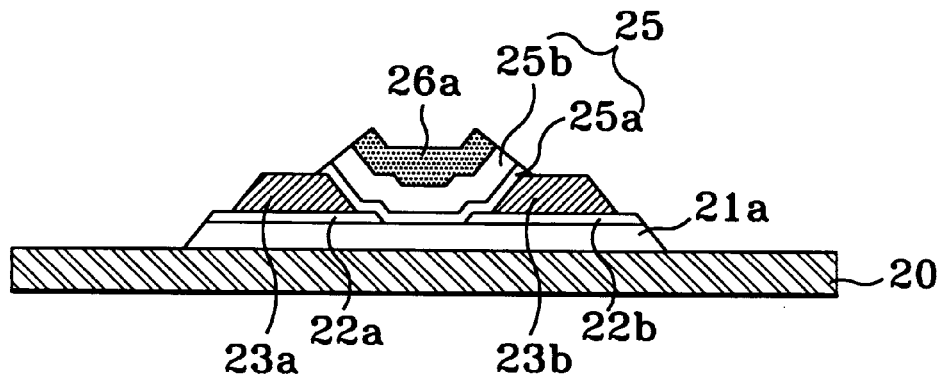
Figure 1H:
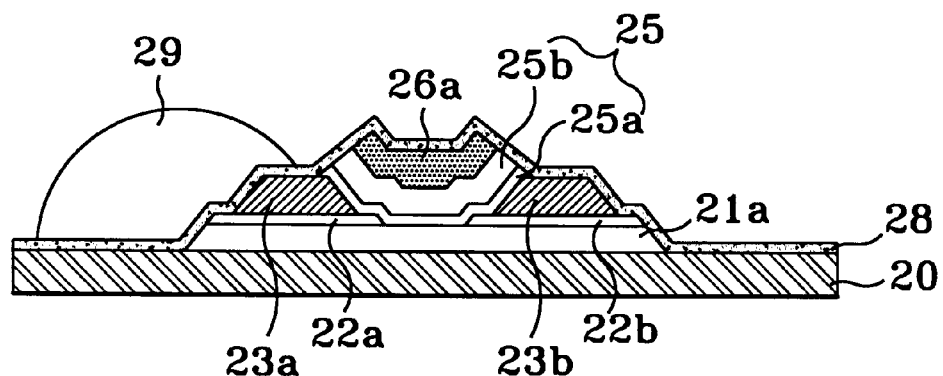
Figure 1I:
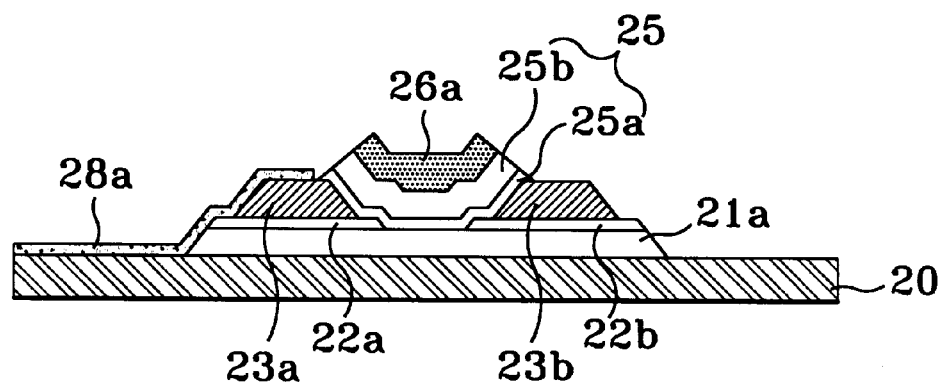

Referring to FIG. 1H, a transparent metal layer, preferably an indium tin oxide (ITO) layer 28 is deposited on the structure of FIG. 1G and then a third mask 29 is formed thereon by a third mask process using photolithography. The ITO layer 28 is then etched using the third mask 29 as an etch mask, to form a pixel electrode 28a being in contact with the source electrode 23a, as shown in FIG. 1I. At this time, a gate line is electrically connected to a data line by the ITO layer 28, in a pad region as not shown in FIG. 1I. Thereafter, the third mask 29 is removed by a well-known method.

According to the present invention, a semiconductor layer acting as a channel layer is firstly formed on a substrate. Ohmic layers are formed by etching using source and drain electrodes as an etch mask and the channel layer is formed by etching using the ohmic layers as an etch mask. Furthermore, when forming a pixel electrode, a gate line is connected to a data line by an ITO layer in a pad region. Therefore, since masks only are required for forming the source and drain electrode, a gate electrode and the pixel electrode, a three-mask process is required for fabricating a TFT-LCD.

Accordingly, a fabricating process of a TFT-LCD is simplified and cost is reduced. Moreover damage due to the mask process is prevented, thereby improving reliability and yield.

Although the preferred embodiment of this invention has been disclosed for illustrative purpose, those skilled in the art will appreciate that various modifications, additions and substitutions are possible, without departing from the scope and spirit of the invention as described in the accompanying claims.

What is claimed is:

1. A method of manufacturing a thin film transistor-liquid crystal display, comprising the steps of:

forming a semiconductor layer, a doped semiconductor layer and a first metal layer on a transparent insulating layer in sequence;

etching the first metal layer using a first mask to form source and drain electrodes separated from one another by a selected distance;

etching the doped semiconductor layer using the source and drain electrodes as an etch mask to form ohmic layers under the source and drain electrodes without the use of an independent etch mask;

forming a gate insulating layer and a second metal layer on the substrate in sequence;

etching the second metal layer using a second mask to form a gate electrode overlapped with the insides of the source and drain electrodes;

etching the gate insulating layer using the gate electrode as an etch mask to expose the semiconductor layer without the use of an independent etch mask;

etching the semiconductor layer using the ohmic layers as an etch mask to form a channel layer without the use of an independent etch mask;

forming a transparent metal layer on the substrate; and etching the transparent metal layer using a third mask to form a pixel electrode connected to the source electrode.

2. The method according to claim 1, wherein when forming the pixel electrode, a gate line is connected to a data line by the transparent metal layer in a pad region.

3. The method according to claim 2, wherein the transparent metal layer is formed of an indium tin oxide layer.

4. The method according to claim 1, wherein the semiconductor layer is formed of a silicon layer.

5. The method according to claim 1, wherein the semiconductor layer is formed of an amorphous silicon layer.

6. The method according to claim 1, wherein the doped semiconductor layer is formed of an N+ silicon layer.

7. The method according to claim 1, wherein the doped semiconductor layer is formed of an N+ amorphous silicon layer.

8. The method according to claim 1, wherein the gate insulating layer is formed by depositing a silicon oxynitride layer and a silicon nitride layer sequentially.

9. The method according to claim 1, wherein the channel layer is formed subsequent to the formation of the gate electrode.

10. The method according to claim 1, wherein the gate insulating layer is at least partially formed on the source and drain electrodes; and the second metal layer is formed on the gate insulating layer.

11. The method according to claim 1, wherein the transparent metal layer is at least partially formed on the source, drain and gate electrodes.

* * * * *

UNITED STATES PATENT AND TRADEMARK OFFICE
CERTIFICATE OF CORRECTION

PATENT NO.     : 6,140,158
DATED          : October 31, 2000
INVENTOR(S)    : Jeong Hun Rhee and Seong Sil Im It is certified that error appears in the above-identified patent and that said Letters Patent is hereby corrected as shown below:

<u>Title page,</u>
Item [56], References Cited, FOREIGN PATENT DOCUMENTS, add the following information:
-- 9-270976     10/1997     Japan --

Signed and Sealed this

Fourteenth Day of October, 2003

JAMES E. ROGAN
*Director of the United States Patent and Trademark Office*